United States Patent
Hsu et al.

(10) Patent No.: US 7,657,025 B2
(45) Date of Patent: Feb. 2, 2010

(54) MICROPHONE MODULE AND METHOD FOR FABRICATING THE SAME

(75) Inventors: Wei-Chan Hsu, Cupertino, CA (US); Li-Te Wu, Taipei (TW); Bing-Ming Ho, Chiai Hsien (TW)

(73) Assignee: Fortemedia, Inc., Cupertino, CA (US)

( * ) Notice: Subject to any disclaimer, the term of this patent is extended or adjusted under 35 U.S.C. 154(b) by 512 days.

(21) Appl. No.: 11/457,847

(22) Filed: Jul. 17, 2006

(65) Prior Publication Data

US 2008/0037768 A1 Feb. 14, 2008

(51) Int. Cl.
  *H04M 1/00* (2006.01)
  *H04M 9/00* (2006.01)
  *H04R 25/00* (2006.01)
(52) U.S. Cl. ...................... 379/429; 381/361
(58) Field of Classification Search ............ 379/428.01, 379/429, 433.03; 381/355, 369, 361
See application file for complete search history.

(56) References Cited

U.S. PATENT DOCUMENTS

| 5,410,608 | A | 4/1995 | Lucey et al. |
| 6,633,647 | B1 | 10/2003 | Markow et al. |
| 2004/0151333 | A1 | 8/2004 | Kral et al. |
| 2005/0207605 | A1 | 9/2005 | Dehe et al. |

OTHER PUBLICATIONS

International Search Report and Written Opinion.

*Primary Examiner*—Tuan D Nguyen
(74) *Attorney, Agent, or Firm*—Thomas, Kayden, Horstemeyer & Risley

(57) ABSTRACT

A microphone module. The module comprises a carrier having a first side and an opposing second side and comprising a through hole. A microphone is disposed on the first side of the carrier and corresponding to the through hole. A processing chip is disposed on the first side of the carrier and coupled to the microphone. An encapsulant is disposed on the first side of the carrier to encapsulate the microphone and the processing chip.

17 Claims, 5 Drawing Sheets

MICROPHONE MODULE AND METHOD FOR FABRICATING THE SAME

BACKGROUND OF THE INVENTION

1. Field of the Invention

The invention relates to a microphone, and in particular to a microphone module for a communication apparatus.

2. Description of the Related Art

Cellular phone can be widely divided into a bar type and a fold type. The fold type cellular phone has an advantage over the bar type one including better voice quality due to the microphone closer to the user's mouth. This is pronounced when the size of the telephone is reduced because the microphone in a bar type moves further from the user's voice. No matter what type of the cellular phone, however, thinness of the cellular phone is limited due to the need to maintain a distance between the front side of the phone housing and the printed circuit board (PCB) therein for disposing the microphone.

FIG. 4 is a cross section of a bar type cellular phone according to the related art. The cellular phone 400 comprises a phone housing 402, a phone PCB 406 and a liquid crystal display (LCD) device 410. The front side of the phone housing 402 has an acoustic hole 403 and a display window 405. A plurality of keypads 404 is disposed on the front side of the phone housing 402. The phone PCB 406 is placed in the phone housing 402 and has a front side 406a facing the keypads 404 and a rear side 406b. The LCD device 410 is placed in the phone housing 402, corresponding to the display window 405 and coupled to the phone PCB 406. Generally, to achieve a thinner phone design, electronic components (not shown) are all disposed on the same side of the phone PCB 406 opposing the keypads 404 (i.e. the rear side 406b of the phone PCB 406). However, in order to maintain optimum acoustic performance, the acoustic hole 403 of the phone 400 must be located at the front side of the phone housing 402 so as to near the user's mouth. Accordingly, a microphone 408 is usually mounted on the front side 406b of the phone PCB 406 and corresponds to the acoustic hole 403. As a result, thinness of the cellular phone 400 is limited due to the need to maintain a space between the front side of the phone housing 4020 and the phone PCB 406 for disposing the microphone 408.

Additionally, a typical microphone has a holed electret sensor placed in a housing. Two pins are coupled to the sensor and pass through the housing for electronically connecting to external circuits. However, as the development of acoustic technology, such as echo cancellation, noise suppression and beam-forming, such a microphone is no more to meet current and future demands.

Thus, there exists a need in the art for design of an improved microphone structure and a novel microphone arrangement which can solve the mentioned problems.

BRIEF SUMMARY OF INVENTION

A detailed description is given in the following embodiments with reference to the accompanying drawings. A microphone module, a method for fabricating the same, an electronic apparatus and a method for fabricating the same are provided. An embodiment of a microphone module comprises a carrier having a first side and an opposing second side and comprising a through hole. A microphone is disposed on the first side of the carrier and corresponding to the through hole. A processing chip is disposed on the first side of the carrier and coupled to the microphone. An encapsulant is disposed on the first side of the carrier to encapsulate the microphone and the processing chip.

An embodiment of a method for fabricating a microphone module comprises providing a carrier having a first side and an opposing second side and comprising at least one through hole. At least one microphone is provided on the first side of the carrier and corresponding to the through hole. A processing chip is provided on the first side of the carrier and coupled to the microphone. The microphone and the processing chip are encapsulated with an encapsulant.

An embodiment of an electronic apparatus comprises a housing having at least one acoustic hole. A printed circuit board (PCB) is placed in the housing, having a front side facing the acoustic hole of the housing and a rear side, and comprising at least one first through hole substantially aligning the acoustic hole. A microphone module is mounted on the rear side of the PCB, comprising a carrier having a first side and an opposing second side and comprising at least one second through hole substantially aligning the acoustic hole. At least one microphone is disposed on the first side of the carrier and corresponds to the acoustic hole. A processing chip is disposed on the first side of the carrier and coupled to the microphone. An encapsulant is disposed on the first side of the carrier to encapsulate the microphone and the processing chip.

An embodiment of a method for fabricating an electronic apparatus comprises providing a housing having at least one acoustic hole. A PCB is placed into the housing, having a front side facing the acoustic hole of the housing and a rear side and comprising at least one first through hole substantially aligning the acoustic hole. A microphone module is mounted on the rear side of the PCB, wherein the microphone module comprises a carrier having a first side and an opposing second side and comprising at least one second through hole substantially aligning the acoustic hole. At least one microphone is disposed on the first side of the carrier and corresponds to the acoustic hole. A processing chip is disposed on the first side of the carrier and coupled to the microphone. An encapsulant is disposed on the first side of the carrier to encapsulate the microphone and the processing chip.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. The electronic apparatus with the microphone module of the invention will be described in the following with reference to the accompanying drawings.

Figure 1A:
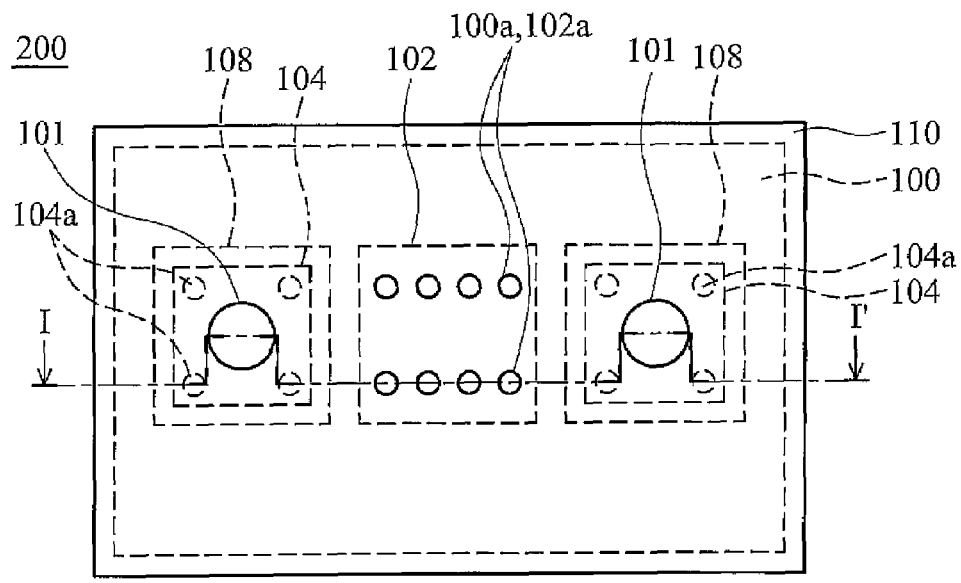
FIG. 1A is a bottom plane view of an embodiment of a microphone module.
Figure 1B:
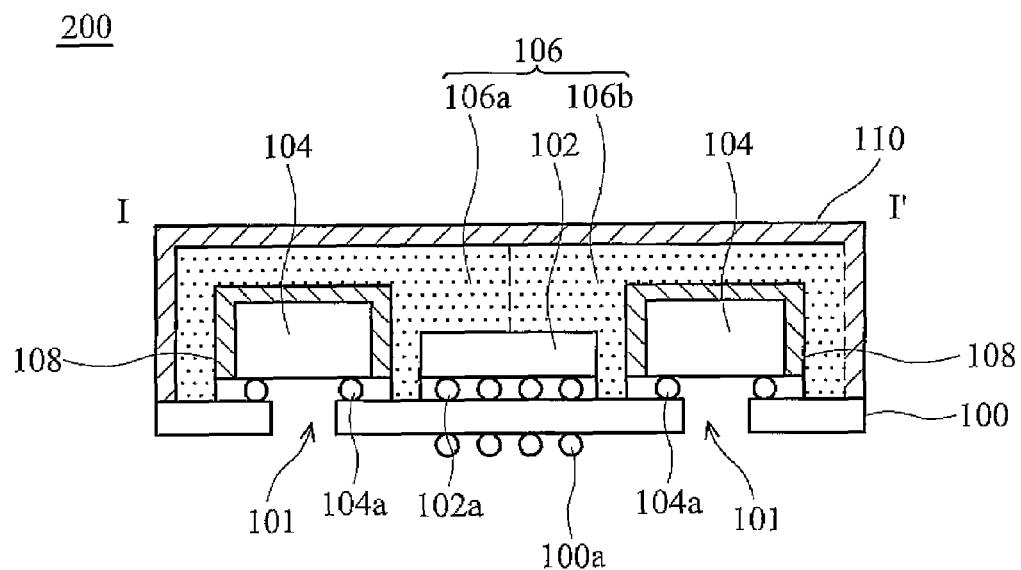
FIG. 1B is a cross section along I-I' line shown in FIG. 1A.

FIG. 1A is a bottom plane view of a microphone module and FIG. 1B is a cross section along I-I' line shown in FIG. 1A. The module 200 comprises at least one microphone 104 and a processing chip 102. In this embodiment, a carrier 100 is provided. The carrier 100 may comprise a printed circuit board (PCB) or a silicon or ceramic substrate. The carrier 100 has a front side and a rear side where a plurality of bumps 100a disposed thereon. Moreover, the carrier 100 has two through holes 101. Next, two microphones 104 and the processing chip 102 are provided. The microphones 104 are subsequently mounted on the front side of the carrier 100 by a plurality of bumps 104a thereunder. Each microphone 104 respectively corresponds to one through hole 101. The processing chip 102 is mounted on the front side of the carrier 100 by a plurality of bumps 102a thereunder.

Figure 2A:
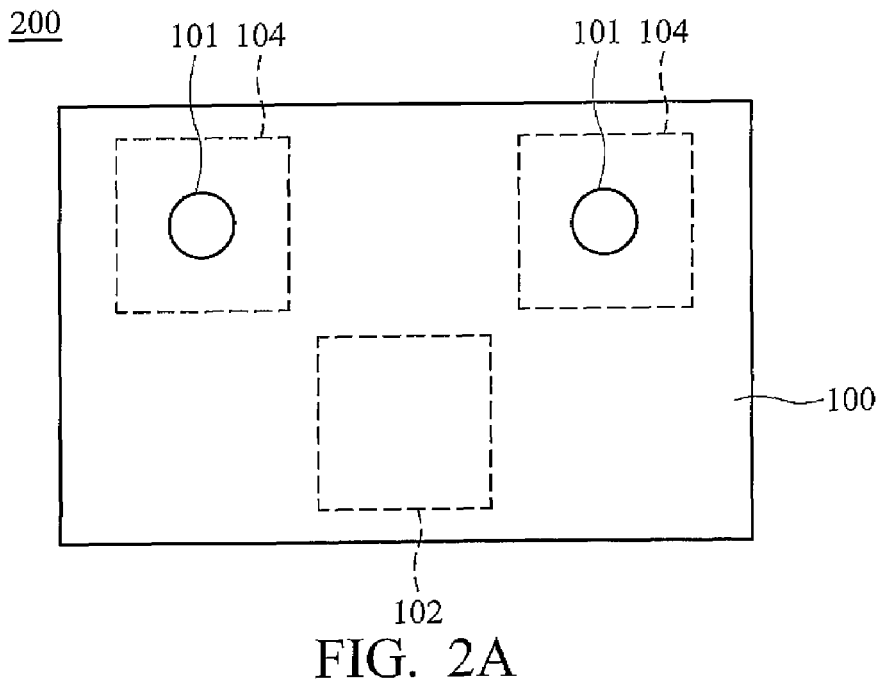
FIGS. 2A to 2C are bottom plane views of various embodiments of arrangement of microphones.
Figure 2B:
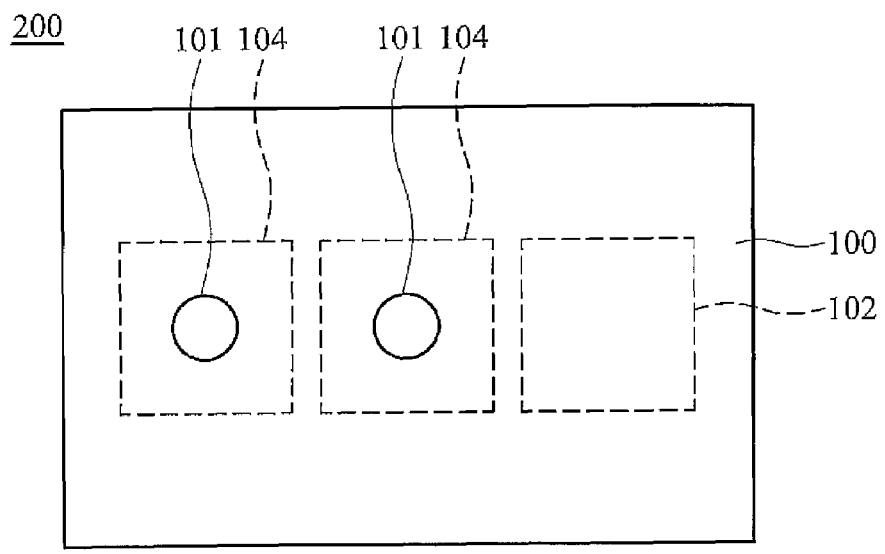
Figure 2C:
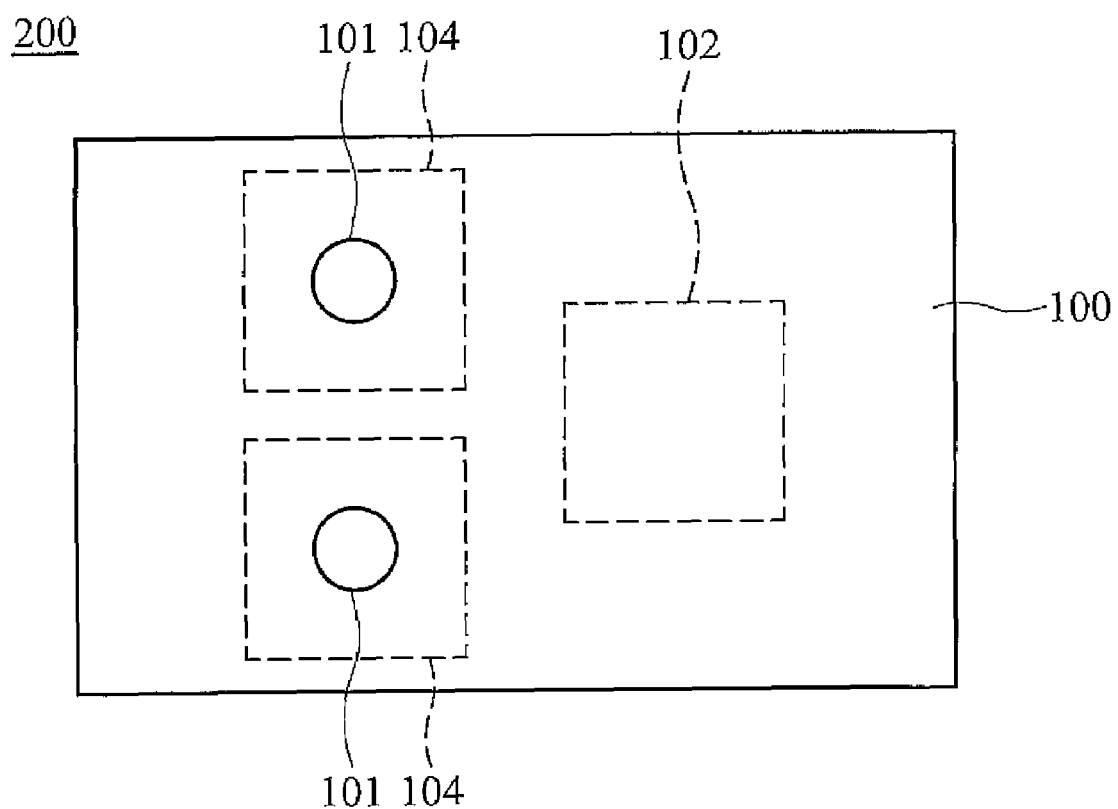

The microphones 104 and the processing chip 102 are substantially arranged in a line, in which the processing chip 102 is located between the microphones 104. In some embodiments, the microphones 104 and the processing chip 102 may have various arrangement. FIGS. 2A to 2C illustrate various arrangements of them. In FIG. 2A, the microphones 104 and the processing chip 102 are substantially arranged in a line, but both microphones 104 are located at the same side of the processing chip 102 (i.e. the left side of the processing chip 102). Also, both microphones 104 may be located at the right side of the processing chip 102. In FIGS. 2B and 2C, the microphones 104 and the processing chip 102 are substantially arranged in a triangular form. For example, both microphones 104 are located at the upper side of the processing chip 102, as shown in FIG. 2B, or at the left side of the processing chip 102, as shown in FIG. 2C. In some embodiments, both microphones 104 may be located at the lower or right side of the processing chip 102.

Both microphones 104 are respectively coupled to the processing chip 102 by bumps 104a and 102a through the carrier 100. Both microphones 104 may be unidirectional type, omnidirectional type, or both types. Moreover, the microphone 104 may be a micro-electro-mechanical system (MENS) microphone or an electret condenser microphone (ECM). Additionally, the processing chip 102 may comprise an analog-to-digital converter (ADC). Moreover, the processing chip 102 may further comprise a digital signal processing (DSP) circuit.

Figure 1C:
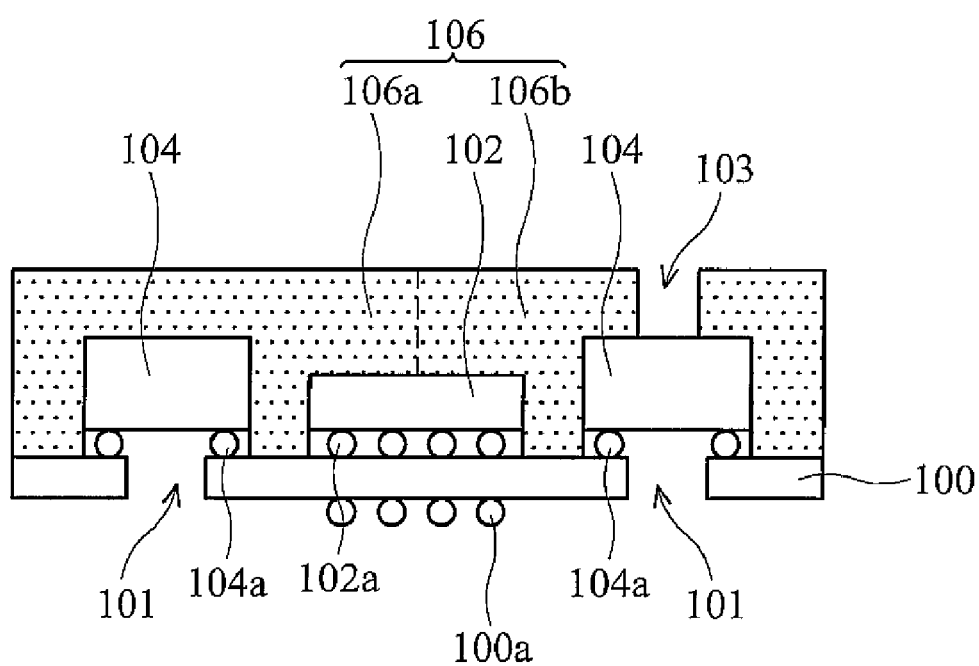
FIG. 1C is a cross section of another embodiment of a microphone module.

Next, a sound isolated material 106, such as silicone elastomer, liquid encapsulant, PVB (Poly vinyl butyral), EVA (Ethylene vinyl acetate) etc., serves as an encapsulant to encapsulate each microphone 104 and the processing chip 102, thereby forming two isolating chamber 106a and 106b for preventing the microphones 104 from mutual interference. Note that when the microphone 104 is unidirectional type, an opening 103 must be further formed in the encapsulant 106 above the microphone 104 to expose thereof, as shown in FIG. 1C.

Additionally, each microphone 104 may be optionally capped with a metal housing 108 for radio frequency (RF) shielding, prior to encapsulation of the microphones 104 and the processing chip 102. That is, each metal housing 108 is inside the encapsulant 106 and between the encapsulant 106 and the microphone 108. In some embodiments, the encapsulant 106 may be optionally capped with a metal housing 110 after encapsulation. That is, the metal housing 110 entirely covers the encapsulant 106.

Figure 3:
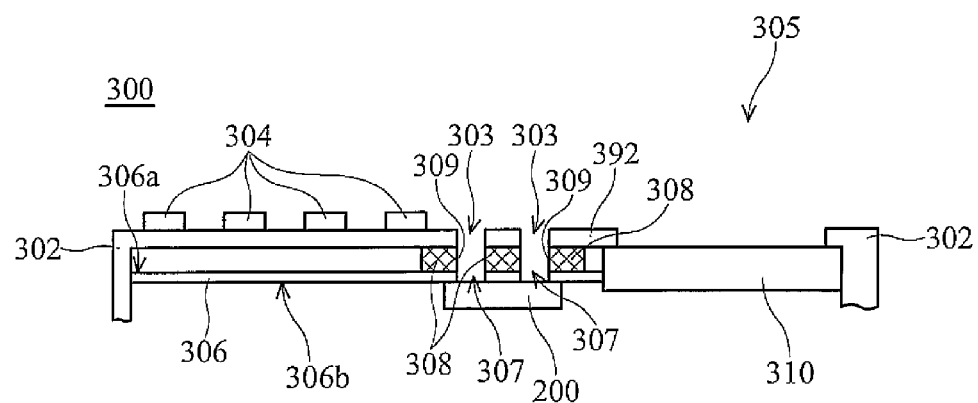
FIG. 3 is a cross section of an embodiment of an electronic apparatus with a microphone module.
Figure 4:
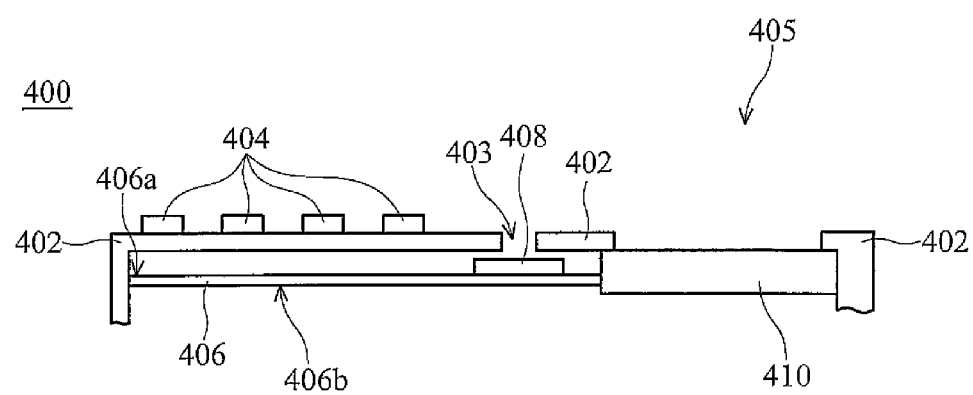
FIG. 4 is a cross section of a bar type cellular phone according to the related art.

FIG. 3 illustrates an electronic apparatus with a microphone module. The electronic apparatus 300 may comprise a cellular phone, a personal digital assistant (PDA), a laptop computer, a desktop, a digital camera, a hearing aid, a display monitor, a television, a media player, or a recorder. In this embodiment, a bar type cellular phone is used as an example of the electronic apparatus 300 in order to simplify the description of the invention. The fabrication of the cellular phone 300 comprises providing a phone housing 302. The phone housing 302 may have a display window 305 and at least one acoustic hole 303 and located at a front side thereof. Moreover, a plurality of keypads 304 is disposed on the front side of the phone housing 302.

A phone PCB 306 is provided and placed into the phone housing 302. The phone PCB 306 has a rear side 306b having electronic components (not shown) disposed thereon and a front side 306a facing the keypads 304 and the acoustic hole 303 of the phone housing 302. Moreover, the phone PCB 306 comprises at least one through hole 307 substantially aligned the acoustic hole 303 of the phone housing 302.

A display device 310, such as an LCD or organic lighting emitting display (OLED) device is placed in the phone housing 302, corresponding to the display window 305 and coupled to the PCB 306.

A rubber gasket 308 is provided and placed between the phone hosing 302 and the front side 306a of the phone PCB 306. Moreover, the rubber gasket 308 has at least one through hole 309 substantially aligned the acoustic hole 303. The rubber gasket 308 can prevent the cellular phone 300 from moisture damage and block lateral propagation of sound wave, thereby improving phone reliability and sound receipt.

A microphone module 200 shown in FIG. 1A or 1B is provided and mounted on the rear side 306b of the phone PCB 306 by surface mount technology (SMT). For example, the bumps 100a of the carrier 100 may be mounted on the bump pads (not shown) on the rear side 306b of the phone PCB 306 by reflow process. Note that each through hole 101 (i.e. the microphone port hole) of the carrier 100 is substantially aligned the corresponding acoustic hole 303. Since the microphone module 200 has two microphones 104, the phone housing 302 has two corresponding acoustic holes 303 and the phone PCB 306 has two corresponding through holes 307. Also, the rubber gasket 308 has two corresponding through holes 309.

According to the invention, since two different directional types of microphones and a processing chip may be integrated in a microphone module, the functions of echo cancellation, noise suppression and beam-forming may be accomplished by the microphone module, thereby increasing microphone performance. Moreover, since is the microphone module is mounted on the rear side of the phone PCB, the thickness of the cellular phone can be further reduced. That is, an extra-thin design for cellular phones can be accomplished.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic apparatus, comprising:
   a housing having at least one acoustic hole;
   a printed circuit board (PCB) placed in the housing, having a front side facing the acoustic hole of the housing and a rear side, and comprising at least one first through hole substantially aligning the acoustic hole; and
   a microphone module mounted on the rear side of the PCB, comprising:

a carrier having a first side and an opposing second side and comprising at least one second through hole substantially aligning the acoustic hole;

at least one microphone disposed on the first side of the carrier and corresponding to the acoustic hole;

a processing chip disposed on the first side of the carrier and coupled to the microphone; and an encapsulant disposed on the first side of the carrier to encapsulate the microphone and the processing chip.

2. The electronic apparatus as claimed in claim 1, further comprising a rubber gasket disposed between the housing and the front side of the PCB, having at least one third through hole substantially aligning the acoustic hole.

3. The electronic apparatus as claimed in claim 1, further comprising a display device coupled to the PCB.

4. The electronic apparatus as claimed in claim 1, wherein the microphone module further comprises a metal housing inside the encapsulant to cap a first microphone.

5. The electronic apparatus as claimed in claim 1, wherein the microphone module further comprising a metal housing to cap the encapsulant.

6. The electronic apparatus as claimed in claim 1, wherein the microphone is omnidirectional or unidirectional type.

7. The electronic apparatus as claimed in claim 1, wherein the microphone is a micro-electro-mechanical system or electret condenser microphone.

8. The electronic apparatus as claimed in claim 1, wherein the electronic apparatus comprises a cellular phone, a personal digital assistant, a laptop computer, a desktop, a digital camera, a hearing aid, a display monitor, a television, a media player, or a recorder.

9. The electronic apparatus as claimed in claim 1, wherein the at least one microphone comprises a plurality of microphones.

10. The electronic apparatus as claimed in claim 9, wherein the encapsulant provides sound isolation between a first microphone and a second microphone of the plurality of microphones.

11. The electronic apparatus as claimed in claim 1, wherein the front side of the PCB faces a keypad disposed in the housing.

12. The electronic apparatus as claimed in claim 1, wherein the front side of the PCB faces a display window disposed in the housing.

13. A method for fabricating an electronic apparatus, comprising:

providing a housing having at least one acoustic hole;

placing a printed circuit board (PCB) into the housing, having a front side facing the acoustic hole of the housing and a rear side, and comprising at least one first through hole substantially aligning the acoustic hole; and mounting a microphone module on the rear side of the PCB, wherein the microphone module comprises:

a carrier having a first side and an opposing second side and comprising at least one second through hole substantially aligning the acoustic hole;

at least one microphone disposed on the first side of the carrier and corresponding to the acoustic hole;

a processing chip disposed on the first side of the carrier and coupled to the microphone; and an encapsulant disposed on the first side of the carrier to encapsulate the microphone and the processing chip.

14. The method as claimed in claim 13, further placing a rubber gasket between the housing and the front side of the PCB, having at least one third through hole substantially aligning the acoustic hole.

15. The method as claimed in claim 13, further providing a display device coupled to the PCB.

16. The method as claimed in claim 13, wherein the electronic apparatus comprises a cellular phone, a personal digital assistant, a laptop computer, a desktop, a digital camera, a hearing aid, a display monitor, a television, a media player, or a recorder.

17. The method as claimed in claim 13, wherein the microphone module is mounted on the PCB by surface mount technology.

* * * * *